United States Patent [19]

Bockelmann et al.

[11] 3,891,937

[45] June 24, 1975

[54] CIRCUIT ARRANGEMENT FOR ELECTRONIC GAIN/CONTROL, IN PARTICULAR ELECTRONIC VOLUME CONTROL CIRCUIT

[75] Inventors: Paul Bockelmann, Halstenbek; Wilfried Aschermann, Hamburg, both of Germany

[73] Assignee: U.S. Philips Corporation, New York, N.Y.

[22] Filed: Nov. 29, 1973

[21] Appl. No.: 420,268

[30] Foreign Application Priority Data

Dec. 21, 1972 Germany ........................... 2262580

[52] U.S. Cl. ................................ 330/29; 330/30 D

[51] Int. Cl. ........................... H03q 3/30; H03f 3/68

[58] Field of Search ................ 330/29, 30 D, 26, 28

[56] References Cited

UNITED STATES PATENTS

| | | | |
|---|---|---|---|
| 3,474,347 | 10/1969 | Praglin et al. | 330/30 D |
| 3,684,974 | 8/1972 | Solomon | 330/30 D |
| 3,727,146 | 4/1973 | Hughes | 330/29 |
| 3,731,215 | 5/1973 | Peil et al. | 330/29 |
| 3,790,896 | 2/1974 | Shimizu et al. | 330/29 |

*Primary Examiner*—Stanley D. Miller, Jr.
*Attorney, Agent, or Firm*—Frank R. Trifari; Henry I. Steckler

[57] ABSTRACT

The invention describes an electronic volume control circuit which can be manufactured in integrated circuit form, can be operated at a low battery voltage, has satisfactory input signal compatibility and comparatively low noise. A transistor differential amplifier is provided the emitter lead of which includes a transistor which passes the direct current and the signal current. A negative-feedback path is provided from that collector terminal of the differential amplifier which is not used as a signal output to the input of the transistor included in the emitter lead.

6 Claims, 2 Drawing Figures

CIRCUIT ARRANGEMENT FOR ELECTRONIC GAIN/CONTROL, IN PARTICULAR ELECTRONIC VOLUME CONTROL CIRCUIT

The invention relates to a circuit arrangement for electronic gain control, in particular an electronic volume control circuit, including at least one transistor differential amplifier in the emitter lead of which a transistor (a signal transistor) is connected which carries a direct current and a signal current, the gain control being effected by means of a control voltage applied to the bases of the differential amplifier whilst the output signal can be derived from one of the two collector outputs.

Such a circuit arrangement is described in German Pat. Application No. 2,060,192 laid open to public inspection. A disadvantage of the known circuit arrangement is that comparatively much noise is produced and that a variation in gain entails a variation of the direct voltage at the output.

The latter disadvantage is obviated in the circuit arrangement shown in FIG. 1 which is also described in the said German Pat. Application No. 2,060,192 (FIG. 3). It comprises two cross-connected transistor differential amplifiers, i.e. four transistors $T_{11}$ to $T_{14}$ which each have one electrode in common which each of the three remaining transistors (for example the transistor $T_{11}$ has the emitter in common with the transistor $T_{12}$, the collector in common with the transistor $T_{13}$ and the base in common with the transistor $T_{14}$). The interconnected collectors of the transistors $T_{11}$ and $T_{13}$ are connected to a positive operating voltage via a resistor $R_{11}$ from which the output voltage can be derived. Similarly the interconnected collectors of the transistors $T_{12}$ and $T_{14}$ are connected to the operating voltage via a resistor $R_{12}$. The interconnected emitters of the transistors $T_{11}$ and $T_{12}$ are connected to the collector of a transistor $T_{15}$ the emitter of which is connected to earth via a resistor $R_{13}$ and to the base of which a positive direct voltage is applied, for which reason the transistor $T_{15}$ hereinafter is also referred to as direct-current transistor. Similarly the common emitter lead of the transistors $T_{13}$ and $T_{14}$ includes a transistor $T_{16}$ having an emitter resistor $R_{14}$ the resistance of which is equal to that of the resistor $R_{13}$. To the base of the latter transistor is applied the sum of a signal voltage $u$ and a direct voltage U exactly equal to the direct voltage applied to the base of the transistor $T_{15}$. The transistor $T_{16}$ is hereinafter also referred to as signal transistor. By means of a control direct voltage $u_{St}$ applied between the interconnected bases of the transistors $T_{11}$ and $T_{14}$ and the interconnected bases of the transistors $T_{12}$ and $T_{13}$ the amplification of the signal $u$ applied to the base of $T_{16}$ can be controlled.

In this circuit arrangement the direct voltage at the output is independent of the control direct voltage. However, the circuit arrangement has the disadvantage that with a given battery voltage and input signal compatibility the amplification of the signal $u$ is limited.

To illustrate this disadvantage it is assumed that the direct voltage U = 3.6 volts and the amplitude of the signal $u = 0.4$ volts and that the maximum gain obtained when the entire signal current of the transistor $T_{16}$ flows through the transistor $T_{13}$ and the resistor $R_{11}$, which gain is equal to the ratio $R_{11}/R_{14}$ is 3. In this case the voltage across the resistor $R_{14}$ is about 4 volts and the voltage across the resistor $R_{11}$ thrice this voltage, i.e. 12 volts. Considering that the collector-emitter voltages of the transistors $T_{16}$ and $T_{13}$ must at least be such as to prevent their collector-base diodes from becoming conducting it will be appreciated that the operating voltage must exceed 16 volts. It is not possible to reduce the direct voltage at the inputs of the transistors $T_{15}$ and $T_{16}$ whilst retaining the signal amplitude, because the distortion factor of such a circuit increases with increase in the amplitude of the alternating voltage compared with the direct voltage. Hence the direct voltage in general is selected so that the alternating-voltage amplitude is less than about 40 percent of the direct voltage.

It is an object of the present invention to provide a circuit arrangement of the type referred to such that with a small input signal and a given low battery voltage a high gain is obtainable without the input being overdriven in the case of a large input signal and reduced gain.

According to the invention this is achieved in that negative feedback operative at least for the signal frequency is provided from the other collector output to the signal transistor. The effect of this step is based on the fact that the negative feedback is increased when the gain is reduced by applying a suitable control voltage, and conversely, because the signal amplitude at the other collector terminal, which does not serve as an output, varies in a sense opposite to the variation of the signal amplitude at the output. If for example the control voltage is chosen so that the entire signal current flows through the output collector resistor, the signal voltage at the other collector output and hence the negative feedback for the signal transistor is zero, resulting in a high signal amplification. If, however, the control voltage is chosen so that as to give rise to a low gain, the negative feedback is large and noise is low.

FIG. 1 represents the prior art gain control circuit while,

An embodiment of the invention is characterized in that it comprises two cross-connected differential amplifiers which each include a transistor in the emitter lead, one of these transistors (direct-current transistor) carrying a direct current and the other one (signal transistor) carrying a corresponding direct current and the signal current. This ensures that the direct voltage at the output is independent of the selected signal amplification.

in the case of pure alternating-current negative feedback the loop amplification may be as large as desired. However, a circuit arrangement using pure alternating-current negative feedback cannot readily be manufactured in integrated-circuit form, especially at low frequencies with a resulting additional direct-current negative feedback. If in this case the gain in particular in the negative-feedback branch is made too large, at a maximum signal amplification the direct current of the direct-current transistor may cut off the signal transistor via the negative-feedback branch. In the embodiment of the invention this may be prevented in that the condition $VR_2/R_9 < 1$ is satisfied, where V is the direct-voltage gain in the negative-feedback branch, $R_2$ is the resistor at the collector output and $R_9$ is the emitter resistor of the directcurrent transistor.

In the embodiment of the invention the negative feedback may be provided via a direct-voltage amplifier which has a low differential output resistance and the output of which is connected via a resistor to the emitter of the signal transistor.

Further advantages and features of the circuit arrangement according to the invention will now be described by way of example with reference to the embodiment shown in FIG. 2.

Figure 2:
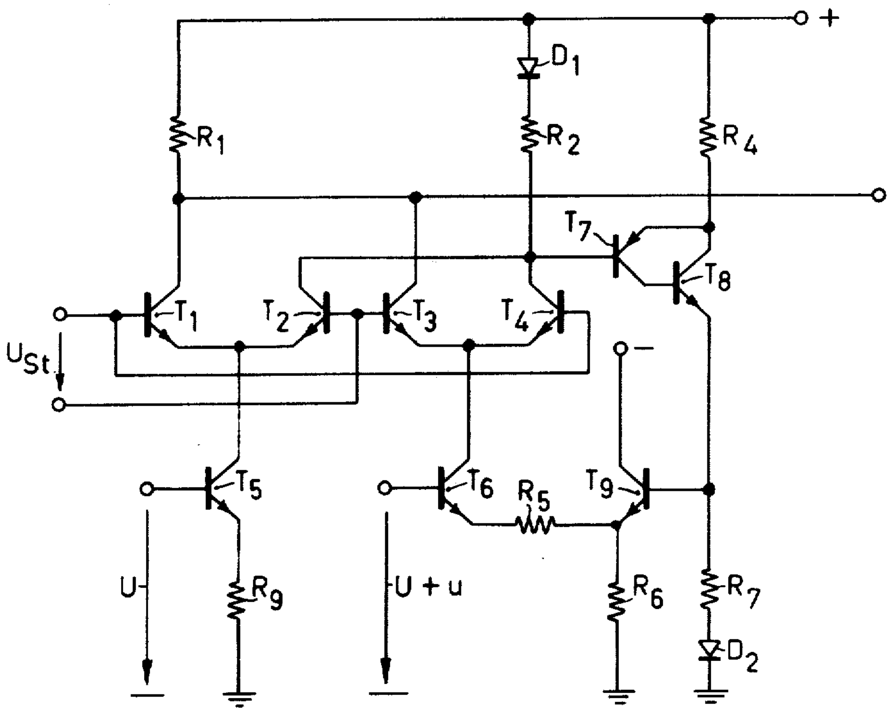
FIG. 2 shows a gain control circuit which embodies the invention.

Referring now to FIG. 2, the circuit arrangement shown may for example be used as an electronic volume control circuit in the low-frequency part of the broadcast receiver. It includes two cross-connected transistor differential amplifiers comprising transistors $T_1$ to $T_4$ which each have one electrode in common with each of the three remaining transistors (for example $T_1$ has the emitter in common with $T_2$, the collector in common with $T_3$ and the base in common with $T_4$). The lead by which the collectors of the transistors $T_3$ and $T_1$ are interconnected and from which the output signals are derived is connected via a resistor $R_1$ of 10 $k\ \Omega$ to the positive terminal of a voltage supply source. The interconnected collectors of the transistors $T_2$ and $T_4$ are connected to the positive terminal of the supply source via the series combination of a resistor $R_2$ of 10 $k\ \Omega$ and a transistor $D_1$ which is connected as a diode and the operation of which will be set out hereinafter. The interconnected emitters of the transistors $T_1$ and $T_2$ are connected to the collector of a transistor $T_5$ the emitter of which is connected to earth via a resistor $R_9$ of 10 $k\ \Omega$ and to the base of which a direct voltage U is applied.

The interconnected emitters of the transistors $T_3$ and $T_4$ are connected to the collector of a transistor $T_6$ the emitter of which is connected to earth via the series combination of a resistor $R_5$ of 3.3 $k\ \Omega$ and a resistor $R_6$ also of 3.3 $k\ \Omega$ and to the base of which is applied the sum of a signal voltage and a direct voltage of the same value as the direct voltage applied to the base of the transistor $T_5$.

Figure 1:
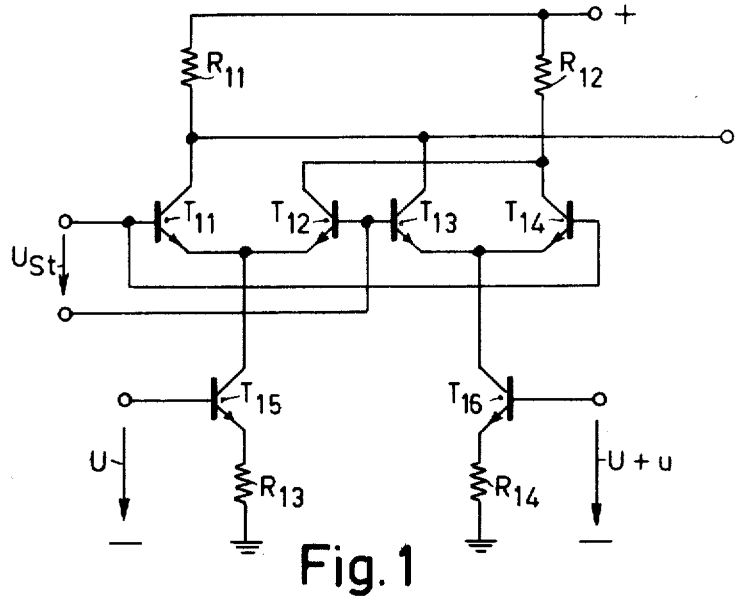

Disregarding the facts that in the circuit arrangement shown in FIG. 2 the collectors of the transistors $T_2$ and $T_4$ are connected to the positive operating voltage via the series combination of a resistor $R_2$ and a diode $D_1$ and that the emitter of the transistor $T_6$ is connected to earth through the series combination of two resistors $R_5$ and $R_6$, the circuit so far described otherwise entirely corresponds to the circuit arrangement shown in FIG. 1.

Additionally, however, the other collector output, i.e. the junction point of the collectors of the transistors $T_2$ and $T_4$, is connected to the base of a transistor $T_7$, which is the only transistor in the circuit arrangement which is of the p-n-p type, all the remaining transistors being of the n-p-n type. The emitter of this transistor is connected to the positive voltage supply terminal via a resistor $R_4$ of 10 $k\ \Omega$. Because the voltage drop across the base-emitter path of the transistor $T_7$ is substantially equal to the voltage drop across the diode $D_1$, the voltage drop across and - since the resistor $R_4$ has the same value (10 $k\ \Omega$) as the resistor $R_2$ — the current through the resistor $R_4$ also are exactly equal to the voltage drop across and the current through the resistor $R_2$ respectively. The collector of the transistor $T_7$ is connected to the base of a transistor $T_8$ the collector of which is connected to the emitter of the transistor $T_7$. The emitter of the transistor $T_8$ is connected to earth via the series combination of a resistor $R_7$ of 6.8 $k\ \Omega$ and a diode $D_2$, which similarly to the diode $D_1$ is constituted by a transistor having its collector and base short-circuited. The emitter of the transistor $T_8$ is also connected to the base of a transistor $T_9$ the emitter of which is connected to the junction point of the resistors $R_5$ and $R_6$ and the collector of which is connected to the positive supply voltage terminal. In this part of the circuit arrangement also the provision of the diode $D_2$ ensures that the voltage drop across the resistor $R_6$ is equal to the voltage drop across the resistor $R_7$.

In order to explain the operation of the circuit arrangement according to the invention it will first be assumed that the transistors $T_1$ to $T_4$ have a control voltage $u_{St}$ such applied to their bases that substantially the entire current of the signal transistor $T_6$ flows through the transistor $T_4$, the resistor $R_2$ and the diode $D_1$, only a small part of the current flowing through the resistor $R_1$ connected to the output. Thus substantially the entire direct current of the direct-current transistor $T_5$ flows through the transistor $T_1$ and the resistor $R_1$ so that across the resistor $R_1$ a direct-voltage drop is produced which is about equal to the direct voltage U applied to the base of the transistor $T_5$, because $R_9$ and $R_1$ have equal values. Because the direct current flowing through the transistor $T_6$ is equal to the direct current flowing through the transistor $T_5$, an equal direct voltage is set up across the resistor $R_2$ but in addition a signal portion corresponding to the signal voltage $u$. The voltage across the resistor $R_2$ is amplified by the transistors $T_7$, $T_8$ and $T_9$ and is fed back via the resistor $R_5$ to the emitter of the transistor $T_6$, resulting in negative feedback which ensures that at the given values of the resistors $R_2$ and $R_4$ to $R_7$ the voltage across the resistor $R_2$ is equal to the voltage at the input of the transistor $T_6$. Consequently with the current distribution described the circuit arrangement shown in FIG. 2 in respect of the amplification of the direct and alternating voltages applied operates similarly to a circuit arrangement as shown in FIG. 1 in which the resistors $R_{11}$ to $R_{14}$ have equal values.

At this setting of the current distribution at which the gain is small the large negative feedback provides a large input-signal compatibility and a particularly low noise voltage at the output.

However, when the control voltage $u_{St}$ is chosen so that the entire current of the transistor $T_6$ can flow through the transistor $T_3$ and the resistor $R_1$ whilst the direct current of the transistor $T_5$ flows through the transistor $T_2$, the resistor $R_2$ and the diode $D_1$, the signal portion at the collectors of the transistors $T_2$ and $T_4$ is zero, so that the signal voltage fed back degeneratively by the negative-feedback amplifier $T_7$, $T_8$ and $T_9$ to the emitter of the transistor $T_6$ is zero as well.

With this current distribution the potential at the emitter of the transistor $T_9$ remains constant owing to the small differential emitter output resistance, whereas the full alternating voltage portion is applied to the emitter of the transistor $T_6$. Thus at this setting the effect in respect of signal amplification is the same as if the resistor $R_5$ were directly connected to earth: in this case also the signal voltage amplification is equal to the ratio $R_1/R_5$, i.e. 3.

On the other hand, at this setting the direct current flowing through the resistor $R_1$ remains unchanged, for the direct current of the transistor $T_5$ produces a direct voltage across the resistor $R_2$ which is amplified according to the ratio $R_7/R_4$ and is applied to the emitter of the transistor $T_9$. The resistor $R_5$ of 3.3 $k\ \Omega$ has a value such that the difference between the voltages at the emitters of the transistors $T_6$ and $T_9$ causes a current to flow through the resistor $R_5$ and the transistor $T_6$ which is equal to the direct current flowing through the transistor $T_5$. The higher the voltage at the emitter of the transistor $T_9$, which voltage is the product of the voltage U at the base of the transistor $T_5$ multiplied by the quotient $R_2R_7/R_9R_4$, the smaller the resistor $R_5$ is to be to ensure that the direct current flowing through the transistor $T_6$ is equal to the direct current flowing through the transistor $T_5$. If the direct voltage at the emitter of the transistor $T_9$ were higher than the direct voltage at the base or at the emitter of the transistor $T_6$, the transistor $T_6$ would be cut off. The quotient $R_2R_7/R_9R_4$ must consequently be less than 1, and preferably a value not too near 1 is used, because otherwise spreads of the resistors greatly effect the direct current (in the embodiment shown the quotient is 0.68).

The direct current flowing through the transistor $T_6$ flows to earth via the resistors $R_5$ and $R_6$. At the same time the resistor $R_6$ passes a direct current which is supplied by the transistor $T_9$ and has a value such that the direct voltage across the resistor $R_6$ is equal to the direct current across the resistor $R_7$. The sum of the resistances of $R_5$ and $R_6$ must at most be equal to the resistance of $R_9$. Moreover, $R_6$ must be smaller than $R_7$; advantageously $R_6$ is equal to $R_7/2$.

Because the direct current flowing through the transistor $T_6$ is equal to the direct current flowing through the transistor $T_5$, with this current distribution the direct-voltage drop across the resistor $R_1$ is not higher than with the aforementioned current distribution. In the case of a direct voltage U of 3.6 volts and an amplitude of the signal voltage *u* of 0.40 volts, the maximum voltage drop across the resistor $R_1$ will be $3 \times 0.4$ volts + 3.6 volts = 4.8 volts. To this voltage are added 0.4 volts + 3.6 volts at the emitter of the transistor $T_6$, so that the circuit arrangement can be operated with a signal amplification of 3 at an operating voltage of less than 15 volts, whereas in a circuit arrangement as shown in FIG. 1 at this amplification and these voltages a direct voltage greater than 16 volts is required, as has been set out at the beginning of this specification. In the case of a direct voltage of 3.6 volts with high grain (in this embodiment a maximum gain of 3) an output signal having a signal amplitude of 1.4 volts is obtainable. With a low gain setting an input signal having a signal amplitude of 1.4 volts can be handled.

With the said current distribution the noise is increased relative to the firstmentioned current distribution, however, it is less important because at this setting the signal amplitudes at the output are larger. Thus, the circuit arrangement according to the invention not only provides a reduction of the operating voltage with equal gain but also result in improved noise properties.

What is claimed is:

1. A gain control circuit comprising at least a first differential amplifier including first and second coupled transistors each having emitter, base, and collector electrodes; a signal transistor means coupled to said emitters for carrying direct and signal currents; means coupled to said bases for applying a gain control voltage thereto; means coupled to one of said collectors for deriving an output signal therefrom; and means for negatively feeding back at least said signal from the remaining collector to said signal transistor.

2. A circuit as claimed in claim 1 further comprising a second differential amplifier including third and fourth coupled transistors, each being cross coupled to said first and second transistors and including an emitter electrode; and a direct current transistor coupled to said third and fourth transistor emitters and carrying a direct current substantially equal to said direct current in said signal transistor.

3. A circuit as claimed in claim 2 wherein said feedback means conveys direct current in addition to said signal, and further comprising a first resistor coupled to said remaining collector; a second resistor coupled to the emitter of said direct current transistor; and wherein the condition $VR_2/R_9 < 1$
is satisfied, wherein $V$ is the direct voltage gain of said feedback means, and $R_2$ and $R_9$ are the resistances of said first and second transistors respectively.

4. A circuit as claimed in claim 1 wherein said feedback means comprises a direct voltage amplifier having an output with a low differential output resistance, and further comprising a third resistor coupled between said feedback means amplifier and the signal transistor emitter.

5. A circuit as claimed in claim 2 wherein said feedback means comprises a direct voltage amplifier having an output with a low differential output resistance and further comprising means for insuring that at the direct-voltage conditions which are produced when the current of the direct-current transistor is caused to flow completely through the other collector output the direct current flowing through the signal transistor is equal to the direct current flowing through the direct-current transistor comprising a third resistor of a selected value coupled between said feedback means amplifier and the signal transistor emitter.

6. A circuit as claimed in claim 5 further comprising a fourth resistor parallel coupled to the direct voltage amplifier and having a value such that the sum of the resistances of the fourth resistor and of the third resistor is smaller than the second resistor.

* * * * *